(12) United States Patent
Tanaka et al.

(10) Patent No.: US 8,455,766 B2
(45) Date of Patent: Jun. 4, 2013

(54) SUBSTRATE WITH LOW-ELASTICITY LAYER AND LOW-THERMAL-EXPANSION LAYER

(75) Inventors: Hironori Tanaka, Gifu (JP); Shuichi Kawano, Gifu (JP)

(73) Assignee: IBIDEN Co., Ltd., Ibi-gun (JP)

(*) Notice: Subject to any disclaimer, the term of this patent is extended or adjusted under 35 U.S.C. 154(b) by 1037 days.

(21) Appl. No.: 12/106,723

(22) Filed: Apr. 21, 2008

(65) Prior Publication Data

US 2009/0038830 A1 Feb. 12, 2009

Related U.S. Application Data

(60) Provisional application No. 60/954,671, filed on Aug. 8, 2007.

(51) Int. Cl.
*H05K 1/03* (2006.01)

(52) U.S. Cl.
USPC .................................. 174/255; 257/E23.062

(58) Field of Classification Search
USPC ................................................. 257/E23.062
See application file for complete search history.

(56) References Cited

U.S. PATENT DOCUMENTS

| | | | | |
|---|---|---|---|---|
| 5,826,330 A | * | 10/1998 | Isoda et al. | 29/852 |
| 5,879,568 A | * | 3/1999 | Urasaki et al. | 216/18 |
| 6,333,857 B1 | * | 12/2001 | Kanbe et al. | 361/792 |
| 6,399,892 B1 | * | 6/2002 | Milkovich et al. | 174/258 |
| 6,516,513 B2 | * | 2/2003 | Milkovich et al. | 29/830 |
| 6,613,986 B1 | * | 9/2003 | Hirose et al. | 174/255 |
| 6,775,150 B1 | | 8/2004 | Chakravorty et al. | |
| 2002/0084522 A1 | * | 7/2002 | Yoshizawa et al. | 257/692 |
| 2003/0045024 A1 | * | 3/2003 | Shimoto et al. | 438/106 |
| 2003/0102153 A1 | * | 6/2003 | Sugaya et al. | 174/256 |
| 2004/0137153 A1 | * | 7/2004 | Thomas et al. | 427/384 |
| 2004/0160751 A1 | * | 8/2004 | Inagaki et al. | 361/763 |
| 2004/0173891 A1 | * | 9/2004 | Imai et al. | 257/686 |
| 2004/0195686 A1 | * | 10/2004 | Jobetto et al. | 257/734 |
| 2005/0006744 A1 | * | 1/2005 | Ooi et al. | 257/686 |
| 2005/0023033 A1 | * | 2/2005 | Saiki et al. | 174/260 |
| 2005/0136634 A1 | | 6/2005 | Savastiouk et al. | |
| 2005/0263867 A1 | | 12/2005 | Kambe et al. | |
| 2006/0180341 A1 | * | 8/2006 | Kariya et al. | 174/255 |
| 2007/0013049 A1 | * | 1/2007 | Asai et al. | 257/700 |
| 2007/0086147 A1 | * | 4/2007 | Kawamura et al. | 361/600 |
| 2007/0256858 A1 | * | 11/2007 | Kariya et al. | 174/260 |

FOREIGN PATENT DOCUMENTS

| | | | |
|---|---|---|---|
| JP | 05147152 A | * | 6/1993 |
| JP | 2001-36253 | | 2/2001 |

(Continued)

*Primary Examiner* — Timothy Thompson
*Assistant Examiner* — Nathan Milakovich
(74) *Attorney, Agent, or Firm* — Oblon, Spivak, McClelland, Maier & Neustadt, L.L.P.

(57) ABSTRACT

A substrate for mounting an IC chip including a printed substrate including a first build-up layer. The first build-up layer including (i) a first conductor layer having first conductor circuits and (ii) a resin insulating layer. The first conductor circuits and the resin insulating layer alternating along a length of the first build-up layer. A low-elasticity resin layer formed on the first build-up layer. A low-thermal-expansion substrate formed of ceramics or silicon, and provided on the low-elasticity resin layer. Through-hole conductors provided through the low-thermal-expansion substrate and the low-elasticity resin layer; and second conductor circuits formed on the low-thermal-expansion substrate. The through-hole conductors electrically connect the first conductor layer and the second conductor circuits provided on the low-thermal-expansion substrate.

9 Claims, 15 Drawing Sheets

FOREIGN PATENT DOCUMENTS

| | | |
|---|---|---|
| JP | 2001-102479 | 4/2001 |
| JP | 2002-289735 | 10/2002 |
| JP | 2004-356569 | 12/2004 |
| JP | 2005-223226 | 8/2005 |
| JP | 2007-027337 | 2/2007 |
| WO | 2006/070807 | 7/2006 |

* cited by examiner

Fig. 1
(A)
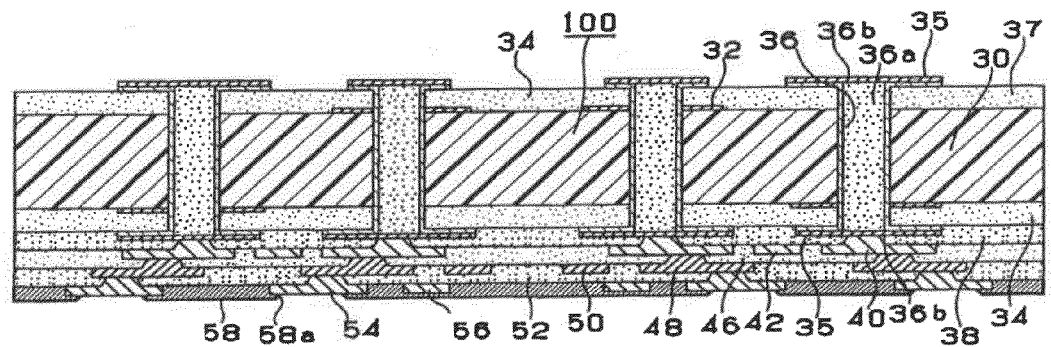
(B)
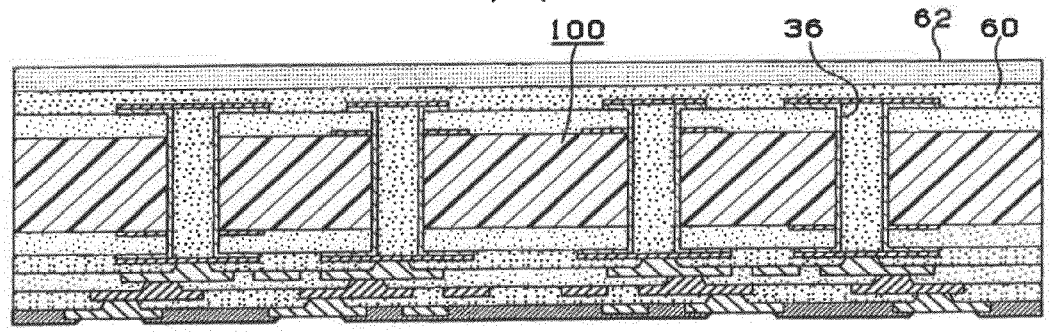
(C)
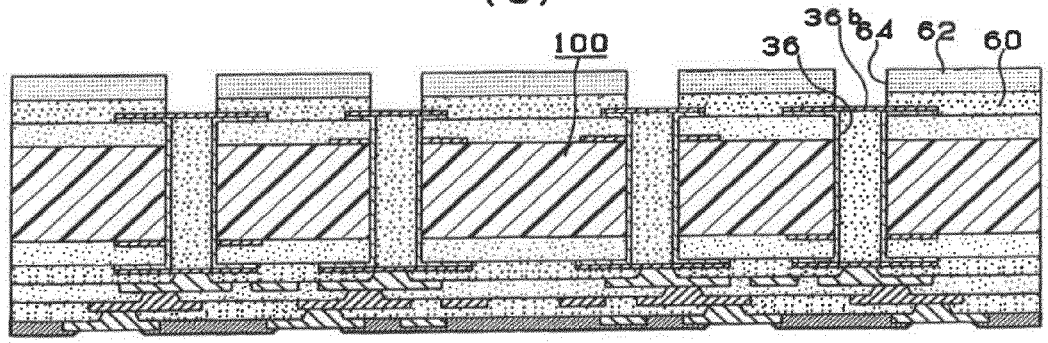

Fig. 2
(A)
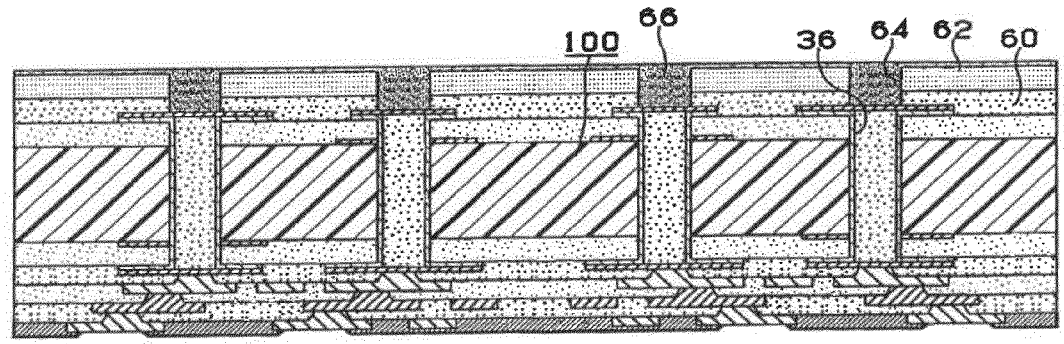
(B)
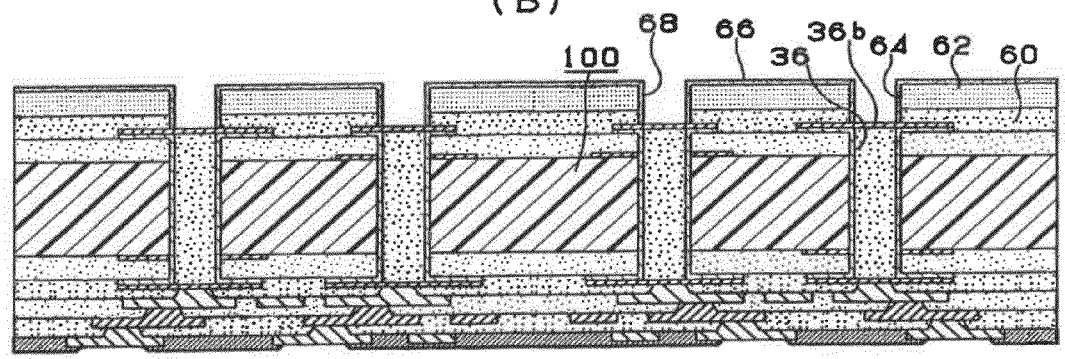
(C)
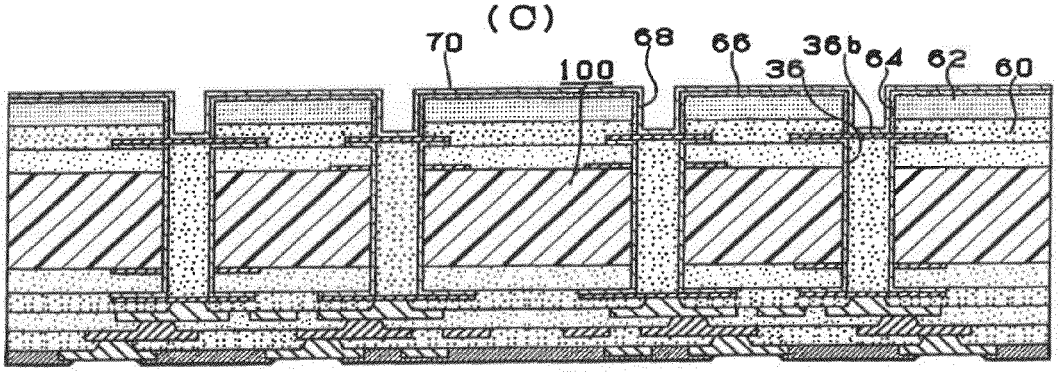

Fig. 3
(A)
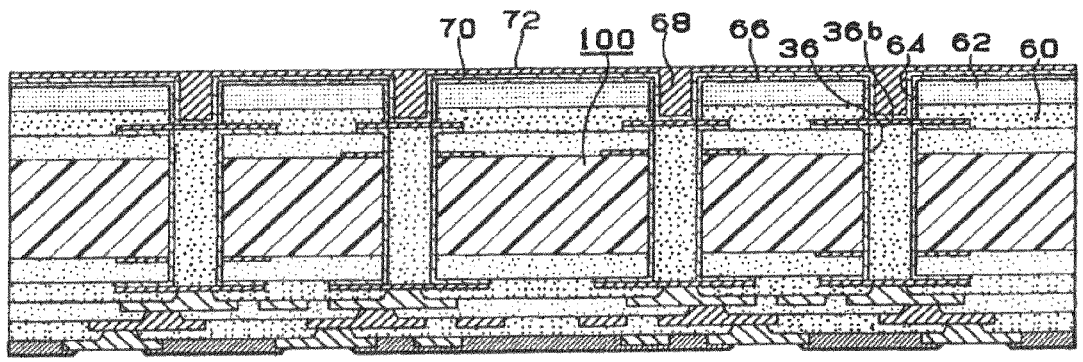
(B)
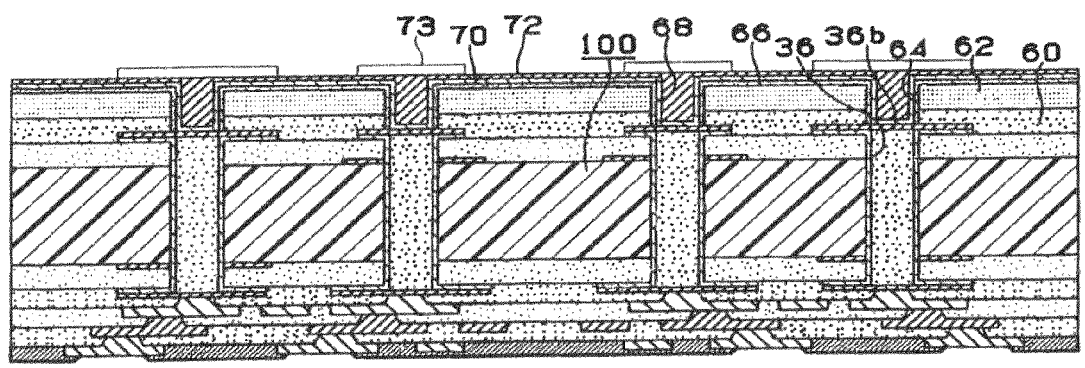

Fig. 4
(A)
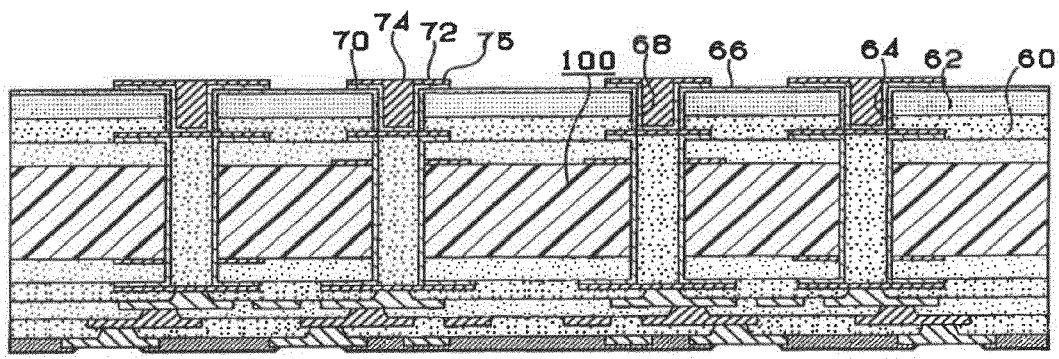
(B)
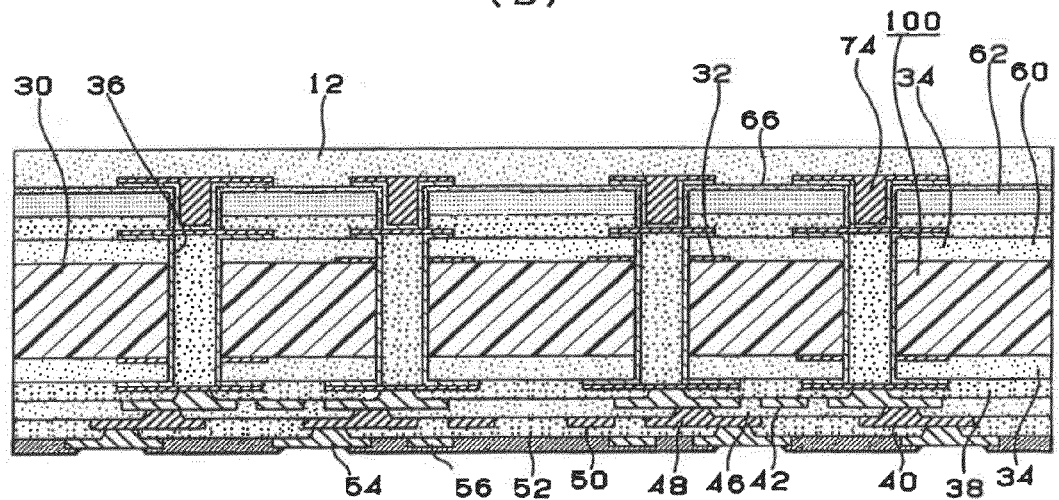

Fig. 5
(A)
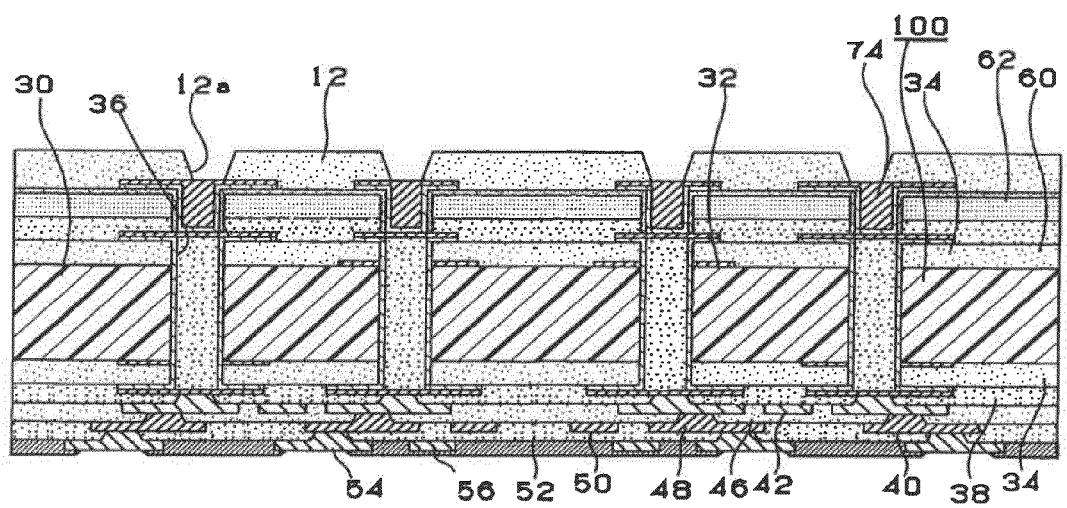
(B)
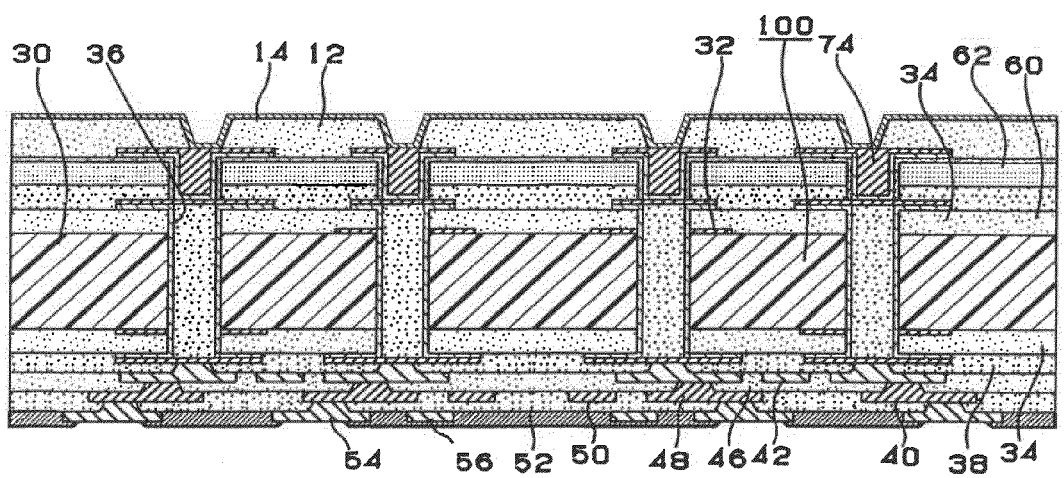

Fig. 6
(A)
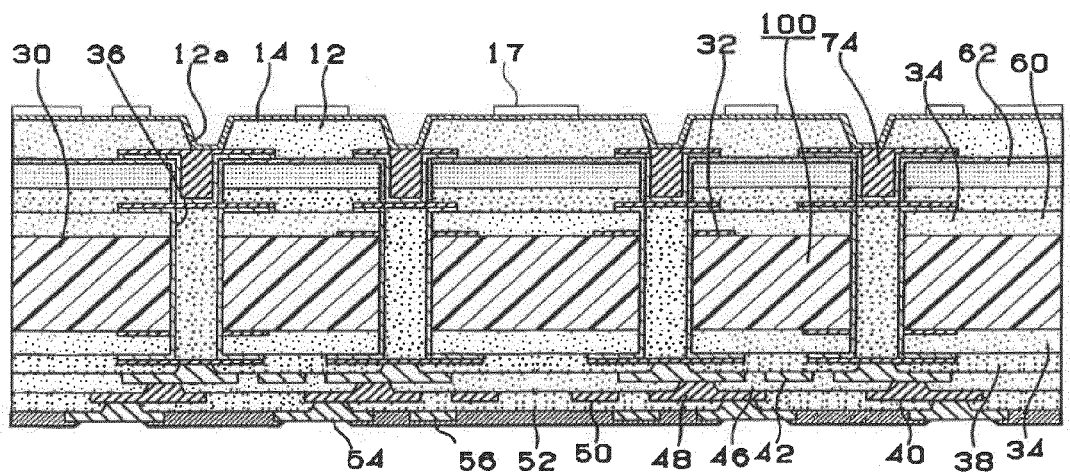
(B)
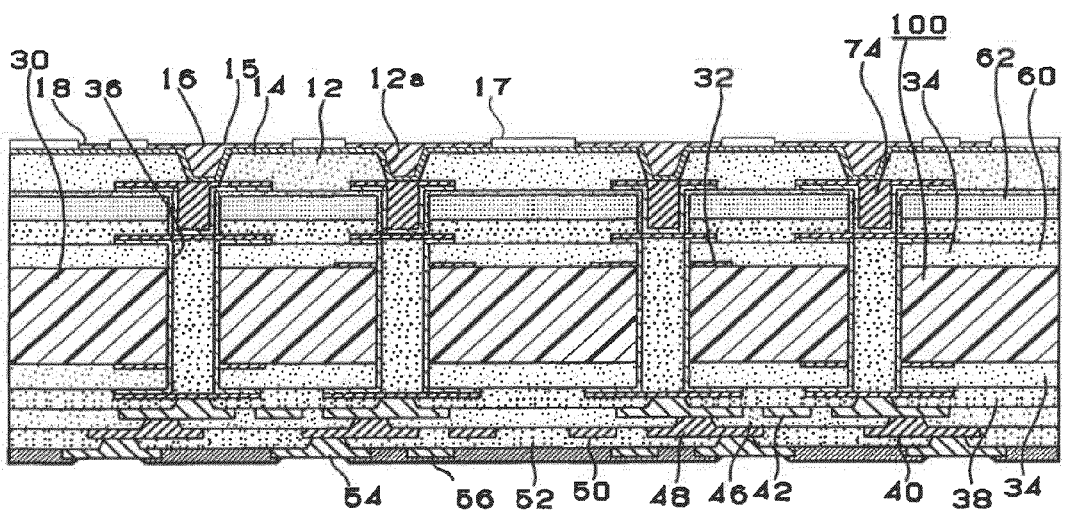

Fig. 7
(A)
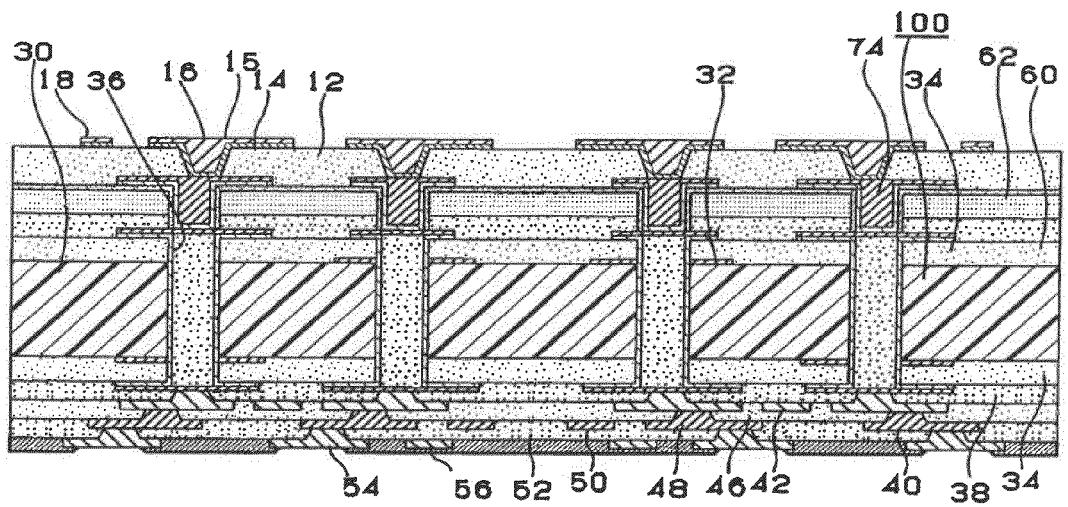
(B)
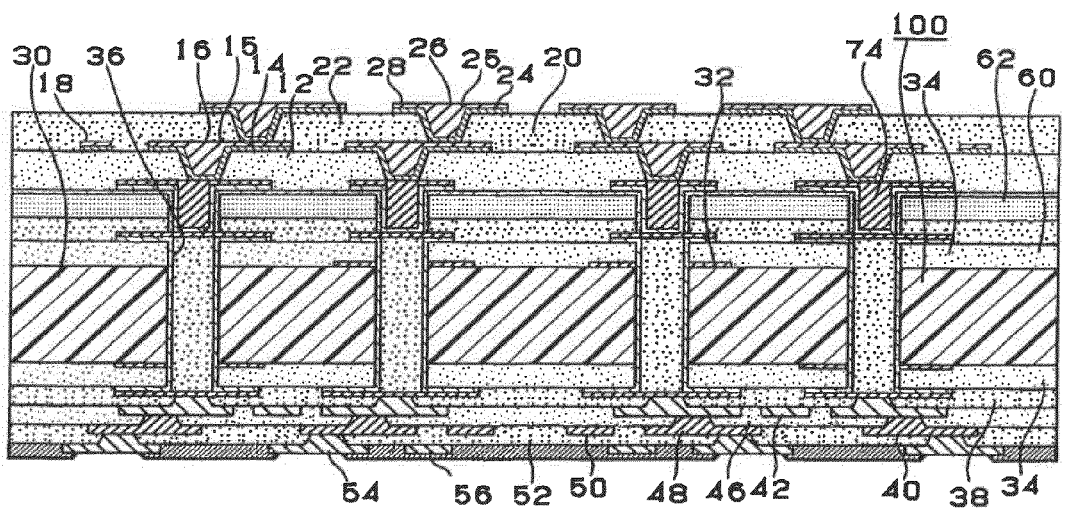

Fig. 13
(A)
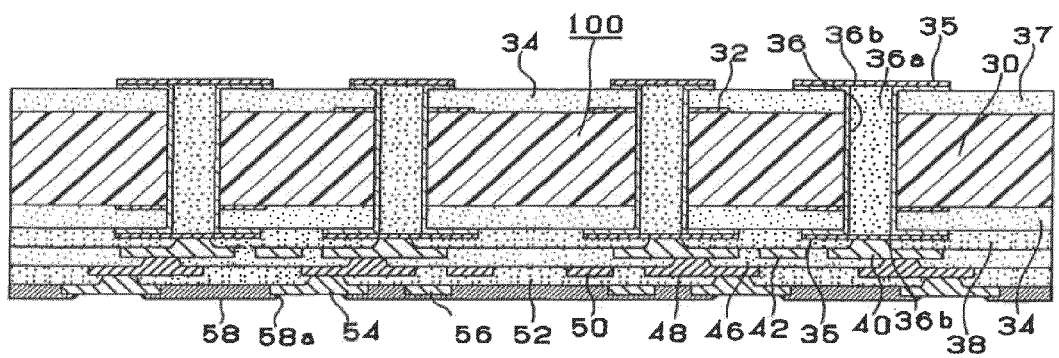
(B)
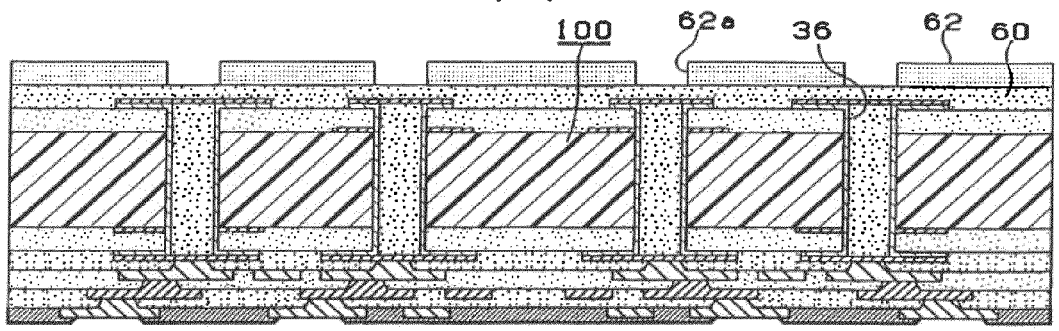
(C)
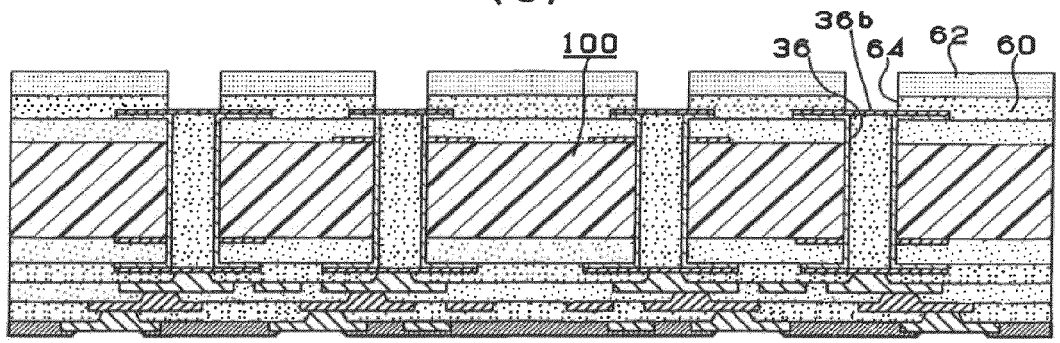

Fig. 15
(A)
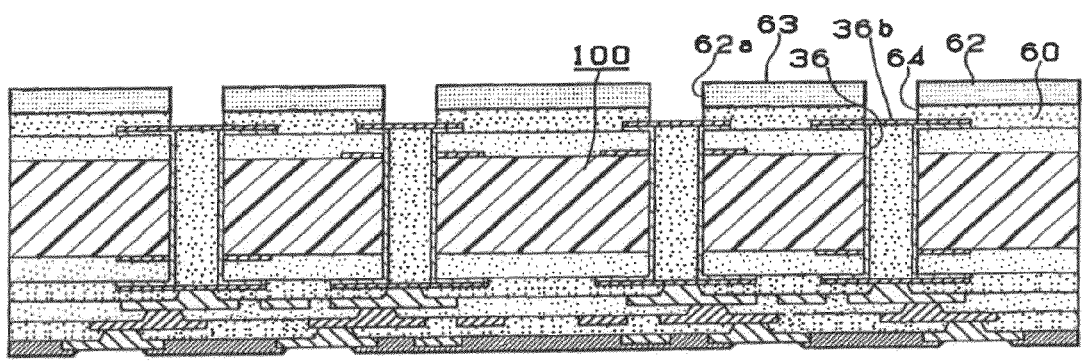
(B)
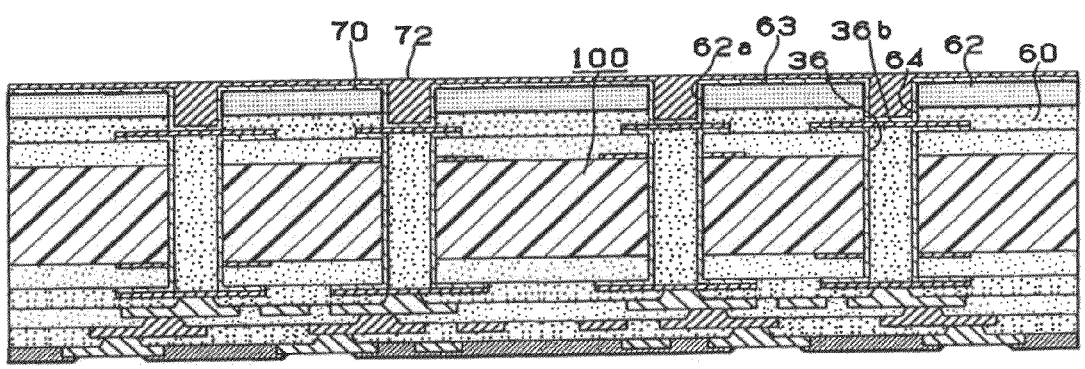

SUBSTRATE WITH LOW-ELASTICITY LAYER AND LOW-THERMAL-EXPANSION LAYER

RELATED APPLICATIONS

This application claims benefit pursuant to 35 USC 119(e) to U.S. provisional application Ser. No. 60/954,671 filed on Aug. 08, 2007, the entire contents of which are incorporated herein by reference.

BACKGROUND OF THE INVENTION

1. Field of the Invention

The present invention relates to a substrate for mounting an IC chip applicable to a package substrate onto which an IC chip is mounted.

2. Description of the Related Art

An IC chip and a package substrate have conventionally been connected with an interposer. The interposer is connected to the pads located on the outermost layer of the package substrate through solder bumps. Japanese Laid-open patent 2001-102479 gazette discloses a semiconductor integrated circuit device wherein a 4-layer wiring interposer is attached to the pads of a rough-pitch substrate through solder bumps. The entire contents of this application is incorporated herein be reference.

However, since the conventional technology is such that the connection between the interposer and the package substrate is made through solder bumps made of a high resistant solder, there occurs a large voltage drop on account of the solder bumps when the IC chip mounted on said interposer instantaneously consumes a large electrical power, resulting in a difficulty of maintaining the voltage value over a certain range and in causing the IC chip to malfunction due to the voltage drop.

Further, the mounting of an interposer onto a package substrate required complex operations such as (i) aligning the solder bumps on the interpose side with the connecting pads of the package substrate, (ii) reflowing, (iii) underfill filling, etc.

SUMMARY OF THE INVENTION

The present invention addresses, among other things, the above-described problems. Thus, an objective of the present invention is to provide a substrate for mounting an IC chip having a low electrical resistance with a built-in inorganic substrate.

In order to achieve this object, among others, the present invention is directed to a substrate for mounting an IC chip including a printed substrate including a first build-up layer. The first build-up layer including (i) a first conductor layer having first conductor circuits and (ii) a resin insulating layer. The first conductor circuits and the resin insulating layer alternating along a length of the first build-up layer. A low-elasticity resin layer is formed on the first build-up layer. A low-thermal-expansion substrate formed of ceramics or silicon is provided on the low-elasticity resin layer. Through-hole conductors are provided through the low-thermal-expansion substrate and the low-elasticity resin layer; and second conductor circuits are formed on the low-thermal-expansion substrate. The through-hole conductors electrically connect the first conductor layer and the second conductor circuits provided on the low-thermal-expansion substrate.

As the connection to interpose a low-thermal-expansion substrate is made through the through-hole conductors without the use of soldering, the electrical resistance of the internal wiring is low. Accordingly, power is smoothly supplied to a mounted IC chip resulting in a small power drop at the IC substrate even when the IC chip consumes a large amount of power instantaneously. Consequently, the voltage level of the IC chip can be maintained within a certain range, and the IC chip can be prevented from malfunctioning.

Further, as the present invention does not require soldering, it requires no complex operations such as alignment for reflowing, underfill filling, etc. Consequently, the manufacture of the IC substrate can be simplified. Further, on account of the use of a ceramic or silicon low-thermal-expansion substrate, the yield can be improved as the low-thermal-expansion substrate is smooth and a dielectric can easily be formed when a thin film capacitor is formed on the low-thermal-expansion substrate. Further, since it is possible for a thin-film capacitor to be formed first on the low-thermal-expansion substrate by sintering and then to be attached to the printed substrate, substrates for mounting an IC chip may be manufactured by attaching only conforming items following sintering to printed substrates irrespective of the yield of the capacitor. Further, since a low-thermal-expansion substrate is attached on the outermost layer of the printed substrate with a low-elasticity resin layer interposed, the stress generated by the difference in thermal expansion coefficient between the printed substrate and the low-thermal-expansion substrate may be absorbed by the low-elasticity resin layer which can prevent the occurrence of internal wire breakage, etc.

The present invention further provides that a low-thermal-expansion substrate provided with a low-elasticity resin layer is interposed on the first build-up layer of the printed substrate, and that the second build-up wiring layer is provided on the low-thermal-expansion substrate. The conductor pads of the first build-up layer of the printed substrate and the second build-up wiring layer are connected by the through-hole conductors formed in the through holes of the low-thermal-expansion substrate. As the connection to interpose a low-thermal-expansion substrate is made through the through-hole conductors without the use of soldering, the electrical resistance of the internal wiring is low. Accordingly, power is smoothly supplied to the mounted IC chip resulting in a small power drop at the IC substrate even when the IC chip consumes a large amount of power instantaneously. Further, since the second build-up wiring layer is provided on a ceramic or silicon smooth low-thermal-expansion substrate, through-hole conductors and a wiring layer (circuit wiring) may be formed in fine pitch.

The present invention further provides that a pitch of the conductor layer (pad) for connecting an IC chip positioned on an outermost layer of the second build-up layer is narrower than a pitch of the through-hole conductors. Consequently, the pins of an IC chip having a fine pitch may be fanned out and connected to a substrate such as a daughter board having a wider pitch.

The present invention further provides that, since the pitch of the conductor layer positioned at the lowermost layer of the second build-up layer is substantially the same as the pitch of the through-hole conductors, through-hole conductors may efficiently be placed in a fixed area.

The present invention further provides that, since the diameter of the through-hole conductors of the low-thermal-expansion substrate is smaller than the diameter of the conductor pads of the second conductor circuit of the low-thermal-expansion substrate, a smaller diameter of the through holes prevents the occurrence of cracks in the thin low-thermal-expansion substrate.

The present invention further provides that, since the thermal-expansion substrate can be made of silicon, the strength of the-thermal-expansion substrate can be maintained even when it is made thin, and the length of the internal wiring can be made shorter by the thickness of the substrate for mounting an IC chip being made thinner.

The present invention further provides that, since the low-elasticity resin layer is made of at least one composition selected from a group of resin compositions including epoxy resin, phenol resin, cross-linking rubber particles, and hardening catalyst, the CTE of the low-elasticity resin layer can easily be adjusted to 50 ppm or lower.

The present invention further provides that, since Young's modulus of the low-elasticity resin layer of the substrate for mounting an IC chip at 30° C. is 10 MPa through 1 GPa, the stress generated by the difference in thermal expansion coefficient between the printed substrate and the low-thermal-expansion substrate may be absorbed by the low-elasticity resin layer which can prevent the occurrence of internal wire breakage, etc.

The present invention further provides that, on the low-thermal-expansion substrate, there is provided at least one passive element such as an inductor, a capacitor, a resistor, or a VRM. Since it is possible for an IC substrate to be formed first on the low-thermal-expansion substrate by sintering and then to be attached to the printed substrate, the IC substrates may be manufactured by attaching only conforming items following sintering to printed substrates irrespective of the yield of the passive element.

The present invention is also directed to a method for manufacturing a substrate for mounting an IC chip including (a) laminating a low-thermal-expansion substrate with a low-elasticity resin layer interposed on a printed substrate having conductor pads for mounting on an outermost layer thereof; (b) boring first through holes through the low-thermal-expansion substrate and the low-elasticity resin layer to reach the conductor pads; (c) filling insulating in the first through holes; (d) boring second through holes through the insulating layers inside the first through holes to reach the conductor pads; (e) forming through-hole conductors by providing plating inside the second through holes; and (f) forming build-up wiring layers on the low-thermal-expansion substrate.

As a consequence of this method, the conductor pads for mounting of the printed substrate and the build-up wiring layer can be connected by the through-hole conductors formed inside the through holes of the low-thermal-expansion substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view of a multilayer build-up wiring board illustrating a method for manufacturing a substrate for mounting an IC chip in accordance with a first embodiment of the present invention.

FIG. 2 is a cross-sectional view of the multilayer build-up wiring board illustrating the method for manufacturing a substrate for mounting an IC chip in accordance with the first embodiment of the present invention.

FIG. 3 is a cross-sectional view of the multilayer build-up wiring board illustrating the method for manufacturing a substrate for mounting an IC chip in accordance with the first embodiment of the present invention.

FIG. 4 is a cross-sectional view of the multilayer build-up wiring board illustrating the method for manufacturing a substrate for mounting an IC chip in accordance with the first embodiment of the present invention.

FIG. 5 is a cross-sectional view of the multilayer build-up wiring board illustrating the method for manufacturing a substrate for mounting an IC chip in accordance with the first embodiment of the present invention.

FIG. 6 is a cross-sectional view of the multilayer build-up wiring board illustrating the method for manufacturing a substrate for mounting an IC chip in accordance with the first embodiment of the present invention.

FIG. 7 is a cross-sectional view of the multilayer build-up wiring board illustrating the method for manufacturing a substrate for mounting an IC chip in accordance with the first embodiment of the present invention.

FIG. 13 is a cross-sectional view of a multilayer build-up wiring board illustrating a method for manufacturing a substrate for mounting an IC chip in accordance with a fourth embodiment of the present invention.

FIG. 15 is a cross-sectional view of a multilayer build-up wiring board illustrating the method for manufacturing a substrate for mounting an IC chip in accordance with the fifth embodiment of the present invention.

DETAILED DESCRIPTION OF THE PREFERRED EMBODIMENTS

Figure 8:
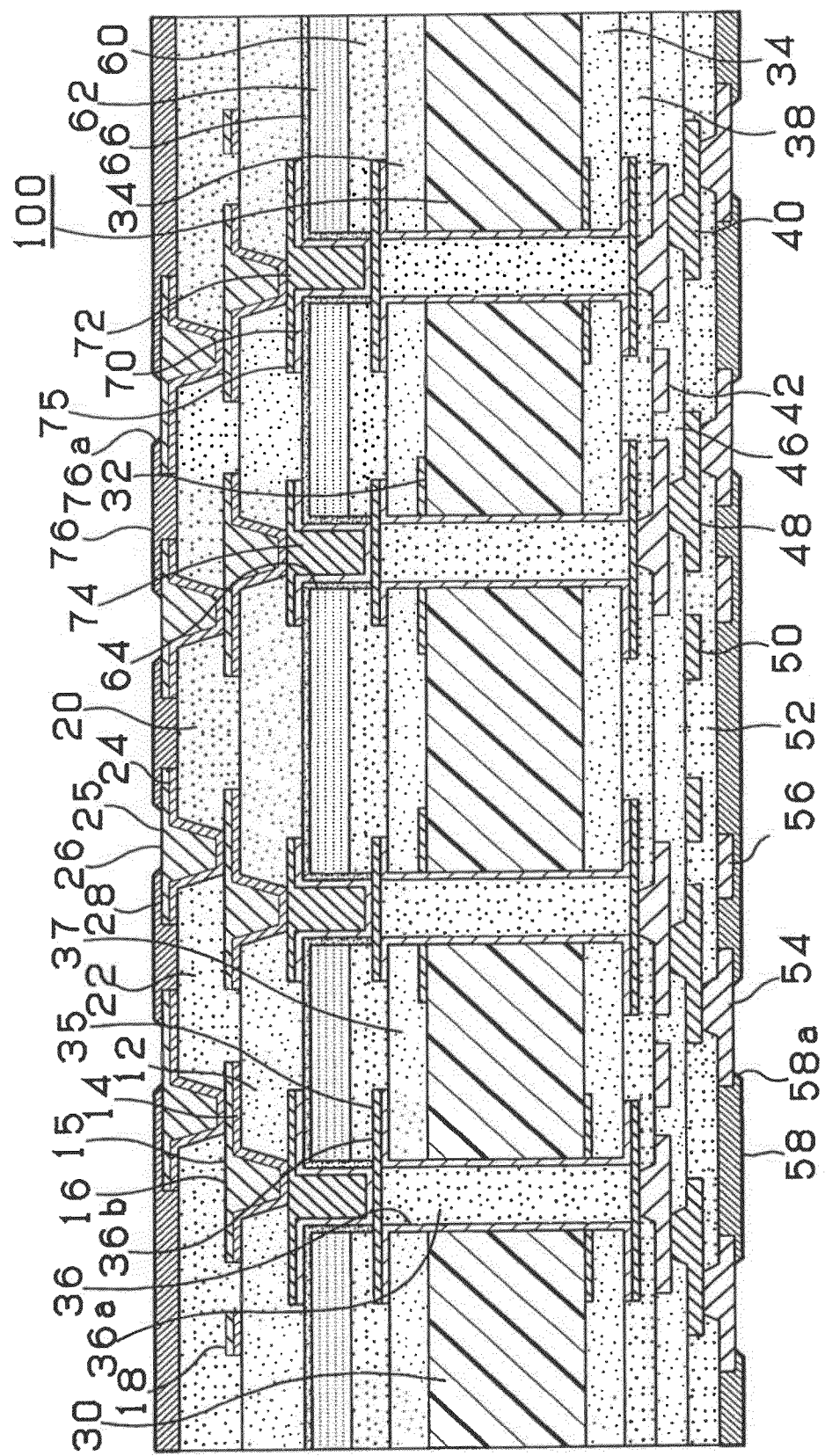
FIG. 8 is a cross-sectional view of a substrate for mounting an IC chip in accordance with the first embodiment of the present invention.
Figure 9:
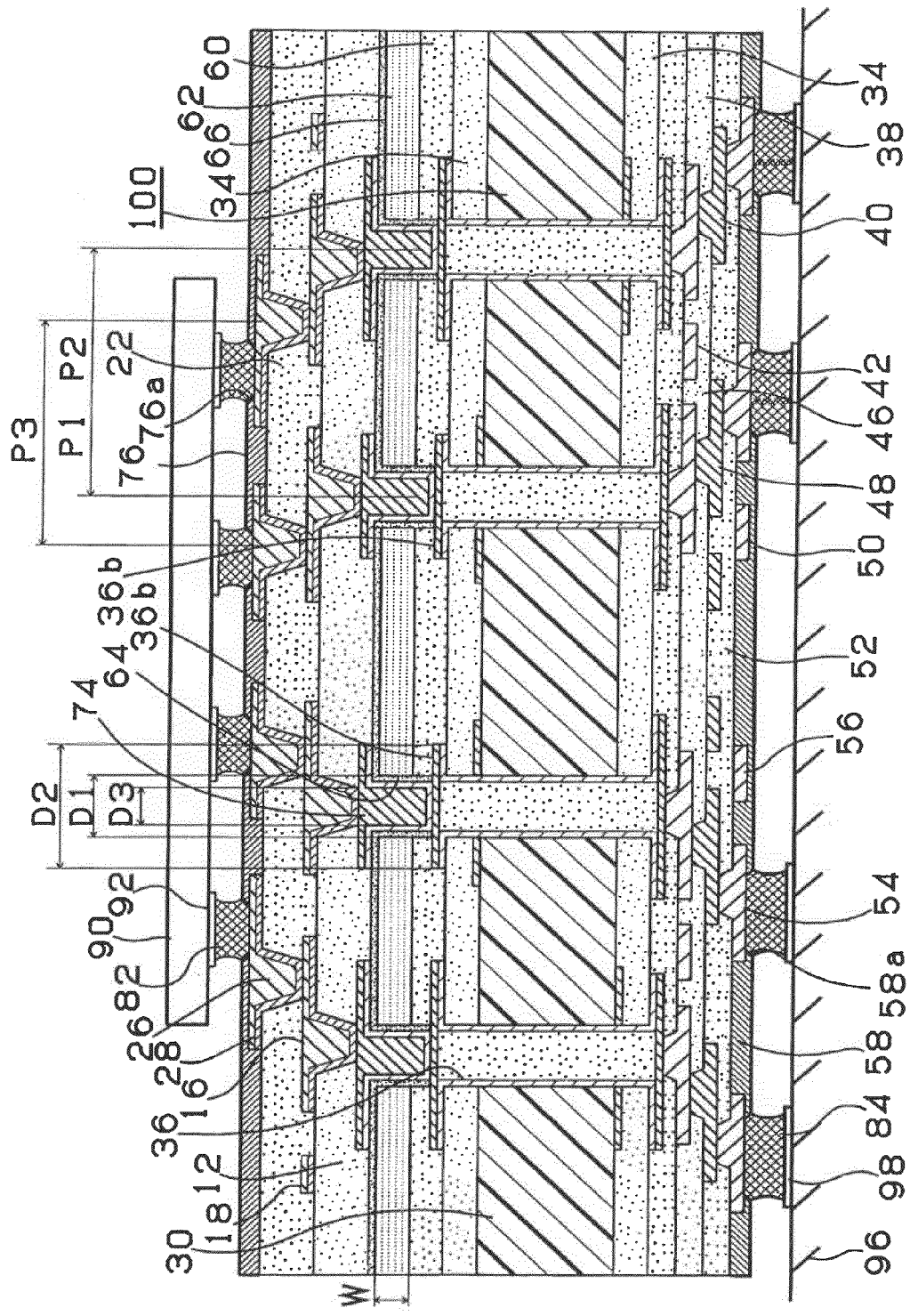
FIG. 9 is a cross-sectional view illustrating a substrate for mounting an IC chip illustrated in FIG. 8 with an IC chip disposed thereon.

Referring now to the drawings, wherein like reference numerals designate identical or corresponding parts throughout the several views. FIG. 1(A) illustrates a cross-sectional view of a multilayer build-up wiring board 100 constituting a substrate for mounting an IC chip (hereinafter referred to as "the IC substrate 100"). FIG. 8 illustrates a cross-sectional view of the IC substrate 100, and FIG. 9 illustrates a view wherein an IC chip 90 is attached to the IC substrate 100 illustrated in FIG. 8 which is disposed on a daughter board 96. As illustrated in FIG. 8, the IC substrate 100 is set forth such that there is provided a silicon substrate 62 on a first build-up layer 37 of the IC substrate 100 illustrated in FIG. 1(A) with a low-expansion resin layer 60 being interposed. Further, there is provided an inter-laminar resin insulating layer 12 having a conductor circuit 18 on the silicon substrate 62, and there is provided an inter-laminar resin insulating layer 22 provided with a conductor circuit 28 on the inter-laminar resin insulating layer 12. The inter-laminar resin insulating layer 12 is connected via-hole conductors 16 and the inter-laminar resin insulating layer 22 is connected via-hole conductors 26. The inter-laminar resin insulating layer 12 having via-holes 16 and a conductor circuit 18 and the inter-laminar resin insulating layer 22 provided with via-holes 26 and a conductor circuit 28 constitute a second build-up layer 20. On the upper layer of the inter-laminar resin insulating layer 22 there is provided a solder resist layer 76, for example, and the conductor circuits 28 and the via-hole conductors 26 exposed at openings 76a of solder resist layer 76 constitute pads for mounting the IC chip 90.

As illustrated in FIG. 1(A), the IC substrate 100 is formed with glass epoxy resin or BT (bis-maleimide triazine) resin wherein on the top and bottom faces of a core substrate 30 provided with a core and made of resin there are provided inter-laminar resin insulating layers 34, 34 and through holes 36 running through the core substrate 30 and inter-laminar resin insulating layers 34. On the surface of the core substrate 30 there are formed conductor circuits 32. Inside the through holes 36 resin 36a, for example, is filled on both end portions lands 36b being formed, and the lands on the upper face constituting conductor pads for mounting 36b. On the inter-laminar resin insulating layers 34 first conductor circuits 35 are formed along with the conductor pads for mounting 36b. The inter-laminar resin insulating layer 34, the conductor pads for mounting 36b, and the first conductor circuits 35 on the upper face side constitute the first build-up layer 37. On the outer layer of said inter-laminar resin insulating layer 34 on the lower side, there is provided an inter-laminar resin insulating layer 38 provided with conductor circuit 50 and via-holes 48, and on the outer layer of said inter-laminar resin insulating layer 38, there is provided an inter-laminar resin insulating layer 52 provided with conductor circuits 50 and via holes 48. On the outer layer of the inter-laminar resin insulating layer 52, a solder resist layer 58, for example, is provided, and the conductor circuits 50 and the via-holes 48 exposed by openings 58a of the solder resist layer 58 constitute pads for connecting to the daughter board 96.

As illustrated in FIG. 9, solder bumps 82 on the upper face side of the IC substrate 100 are connected to pads 92 of the IC chip 90. Solder bumps 84 on the lower face side are connected to pads 98 of the daughter board 96.

As illustrated in FIG. 8, the IC substrate 100 in accordance with this embodiment is set forth such that on the first build-up layer 37 of the IC substrate 100 the low-expansion resin layer 60 is interposed, and the second build-up layer 20 is provided on the silicon substrate 62. The conductor pads for mounting 36b of the IC substrate 100, the first conductor circuits 35, and the second build-up layer 20 are connected by through-hole conductors 74 formed inside through holes 64 of the silicon substrate 62. As the connection to interpose the silicon substrate 62 is made through the through-hole conductors 74 without the use of soldering, the electrical resistance of the internal wiring is low. Accordingly, the power is smoothly supplied to the IC chip 90, resulting in a small power drop at the IC substrate 100 even when the IC chip 90 consumes a large amount of power instantaneously.

As the present invention does not require soldering, no complex operations such as alignment for reflowing, underfill filling, etc., are required allowing the manufacture process to be simplified. Further, since the second build-up layer 20 is provided on a smooth low-thermal-expansion substrate 62, the via-hole conductors 16, 26 and the wiring layers (circuit wiring) 18, 28 may be formed in fine pitch.

Further, since the silicon substrate 62 is attached on the outermost layer of the IC substrate 100 with a low-elasticity resin layer 60 interposed, the stress generated by the difference in thermal expansion coefficient between the IC substrate 100 (in particular the core substrate 30) and the silicon substrate 62 may be absorbed by the low-elasticity resin layer, which can prevent the occurrence of internal wire breakage, etc.

The IC substrate 100 in accordance with the first embodiment is set forth such that the silicon substrate 62 can be thin while maintaining strength, and that the length of the internal wiring can be made shorter by the thickness of the IC substrate 100 being made thinner. Further, the configuration of the first embodiment can enhance the heat dissipation property of the IC substrate 100.

The IC substrate 100 in accordance with the first embodiment is set forth such that, since the insulating layer 66 is provided between the through holes 64 of the silicon substrate 62 and the through-hole conductors 74 provided inside the through holes 64, the insulating layer 66 can prevent current from flowing toward the side of the silicon substrate 62 constituting a semiconductor. Further, it can ease the stress on the insulating layer 66 due to the difference in thermal expansion rate between the silicon substrate 66 and the through-hole conductors 74.

As illustrate in FIG. 9, the IC substrate 100 in accordance with the first embodiment is set forth such that a pitch P3 of the conductor layer (pad) for connecting the IC chip 90 positioned on the outermost layer of the second build-up layer 20 is narrower than a pitch P1 of the through-hole conductor 74. Accordingly, the pads 92 of the IC chip 90 having a fine pitch may be fanned out and connected to the pads 98 of the daughter board 96 having a wider pitch.

As illustrate in FIG. 9, the IC substrate 100 in accordance with the first embodiment is set forth such that, since the pitch P1 of the through-hole conductors of the silicon substrate 62 is identical to a pitch P2 of the conductor pads for mounting 36b of the IC substrate 100, through-hole conductors 74 may most efficiently be placed in a fixed area.

The IC substrate 100 in accordance with the first embodiment is set forth such that a diameter D1 of the through-hole conductors 74 of the silicon substrate 62 is smaller than a diameter D2 of the conductor pads for mounting 36b of the IC substrate 100. Accordingly, a smaller diameter D3 of the through holes 64 can prevent the occurrence of cracks in the thin silicon substrate 62. In addition, a high connectivity between the through-hole conductors 76 and the pads 36b is secured.

The IC substrate 100 in accordance with the first embodiment is set forth such that the low-elasticity resin layer 60 is made of at least one composition selected from a group of resin compositions including epoxy resin, phenol resin cross-linking rubber particles and hardening catalyst (deformed amine, multifunctional phenol, imidazole, mercaptan, acid anhydride, etc.). Accordingly, the CTE of the low-elasticity resin layer 60 can easily be adjusted to 50 ppm or lower (preferably, 10 ppm or higher), and the stress generated by the difference in thermal expansion coefficient between the IC substrate 100 (in particular the core substrate 30) and the silicon substrate 62 may be absorbed by the low-elasticity resin layer 60, which can prevent the occurrence of internal wire breakage, etc.

Young's modulus of the low-elasticity resin layer 60 of the IC substrate 100 in accordance with the first embodiment at 30° C. is set to be 10 MPa through 1 GPa. Accordingly, the stress generated by the difference in thermal expansion coefficient between the IC substrate 100 and the low-thermal-expansion substrate 62 may be absorbed by the low-elasticity layer 60, which can prevent the occurrence of internal wire breakage, etc.

A method for manufacturing the above-described IC substrate 100 illustrated in FIG. 8 will be described with reference to FIGS. 1-7. Those steps include (1) adhering the silicon substrate 62 via the low-elasticity resin layer 60 (FIG. 1(B)) to the outermost layer on the upper face side of the first build-up layer 37 using the conductor pads for mounting (through-hole lands) 36b and the first conductor circuits 35 illustrated in FIG. 1(A). Then, the silicon substrate 62 may be polished to smoothen its surface. Accordingly, a build-up layer is easily formed.

(2) Boring openings 64 with a laser through the silicon substrate 62 and the low-elasticity resin layer 60 reaching the conductor pads for mounting 36b (FIG. 1(C)). (3) Forming an insulating layer 66 made of resin inside the openings 64 and on the surface of the silicon substrate 62 (FIG. 2(A)). (4) Forming openings 68 by laser in the insulating layers 66 reaching the conductor pads for mounting 36b inside the openings 64 (FIG. 2(B)). (5) Forming electroless-plated films 70 by electroless plating on the surface of the silicon substrate 62 and on the insulating layers 66 inside the openings 68 (FIG. 2(C)).

(6) Performing electrolysis via the electroless-plated films 70 to fill the inside of the openings 68 with electrolysis plating 72 (FIG. 3(A)). (7) Forming an etching resist 73 of a predetermined pattern (FIG. 3(B)).

(8) After the electrolysis plating 72 and the electroless-plated films are removed by etching at the non-forming portions of the etching resist 73, peeling off the etching resist 73. This process forms through-hole conductors 74 which provide conductivity from the top to the bottom of the silicon substrate 62 and to the second conductor circuits 75 on the silicon substrate 62 (FIG. 4(A)). (9) Forming on the insulating layer 66 of the silicon substrate 62 an inter-laminar resin insulating layer 12 (FIG. 4(B)).

(10) Boring openings 12a into the inter-laminar resin insulating layer 12 with a laser reaching the through-hole conductors 74 (FIG. 5(A)). (11) Forming an electroless-plated film 14 by electroless plating on the surface of the inter-laminar resin insulating layer 12 and inside the openings 12a (FIG. 5(B)).

(12) Forming a plated resist 17 of a predetermined pattern (FIG. 6(A)). (13) Forming an electrolysis plating 15 via the electroless-plated film 14 on the non-formed portions of the plated resist 17 by electrolysis plating (FIG. 6(B)).

(14) Peeling off the plated resist 17, and removing the electroless plated film 14 underneath the plated resist 17 by light etching. This process forms via-hole conductors 16 running through the inter-laminar resin insulating layer 12 and conductor circuits 18 (FIG. 7(A)). (15) Repeating the above-described steps (3)-(14) to form on the inter-laminar resin insulating layer 12 an inter-laminar resin insulating layer 22 provided with via-hole conductors 26 and conductor circuits 28, and completing the second build-up layer 20 including the inter-laminar resin insulating layer 12 and the inter-laminar resin insulating layer 22 (FIG. 7(B)). (16) Forming a solder resist layer 76 provided with openings 76a on the inter-laminar resin insulating layers 22 to manufacture the IC substrate 100 (FIG. 8).

The IC chip 90 is disposed on the IC substrate 100 and the connection pads of the printed wiring board and the pads 92 of the IC chip 90 are connected via solder bumps 82. Following this, the IC substrate 100 is attached to the pads 98 of the daughter board 96 via solder bumps 84 (FIG. 9).

Figure 10:
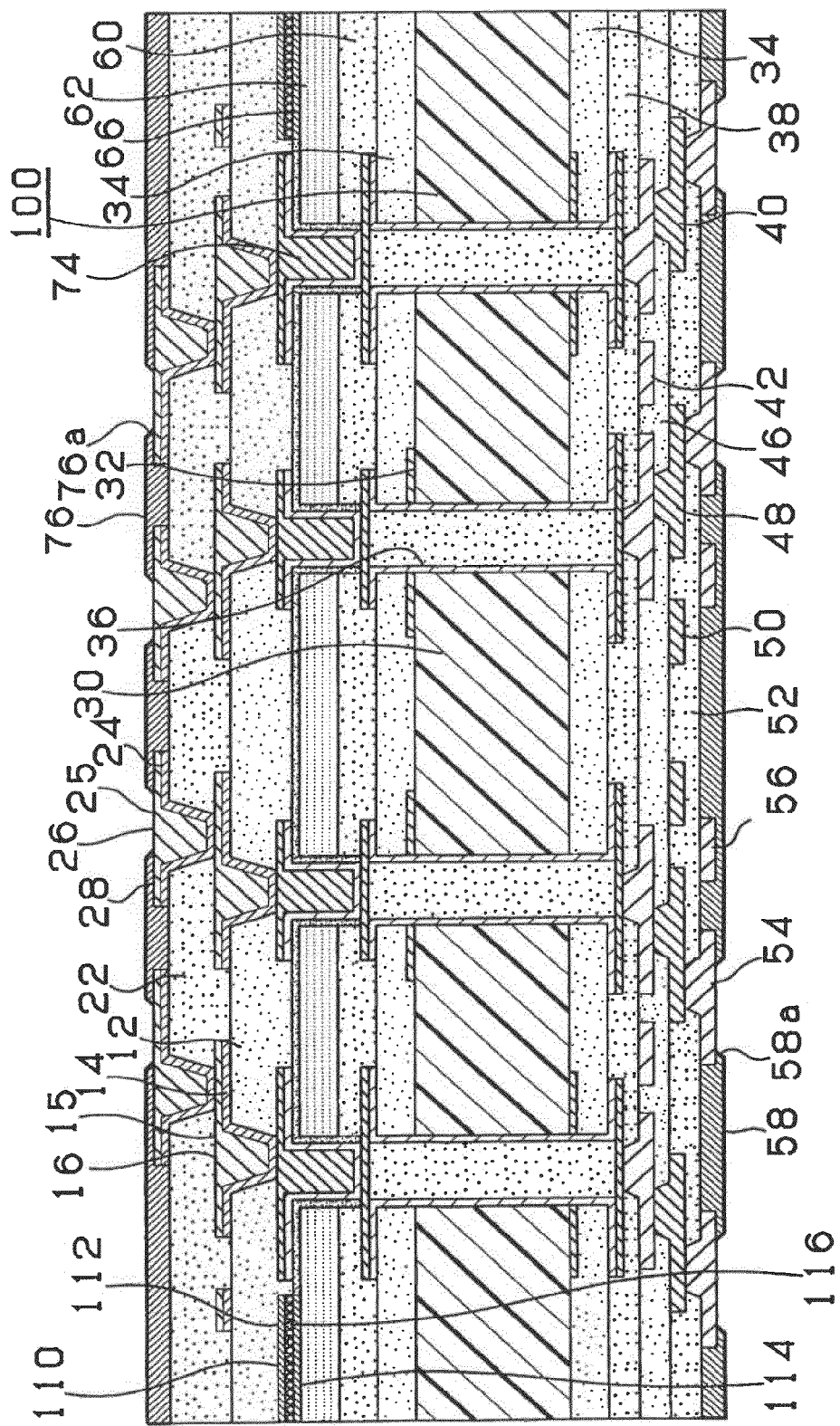
FIG. 10 is a cross-sectional view of a substrate for mounting an IC chip pertaining to a modified first embodiment of the present invention.

FIG. 10 is a cross-sectional view of a modified IC substrate 100 according to the first embodiment of the present invention. In the modified first embodiment, a thin film capacitor 110 formed by sintering is provided on the silicon substrate 62 of the IC substrate 100. The thin film capacitor 110 is set forth such that a dielectric film 116 made of ceramic and having a high dielectric constant is disposed between electrode films 112, 114.

The thin-film capacitor 110 is first formed by sintering on a silicon substrate 62 and then attached to the multilayer build-up wiring board 100. Accordingly, the IC substrate 100 may be manufactured by attaching only conforming items following sintering to the IC substrate 100 irrespective of the yield of the capacitor. Further, when a thin film capacitor is formed on the silicon substrate 62, the silicon substrate 62 is smooth and a dielectric can easily be formed while the yield is improved. In addition, while the capacitor is provided on the silicon substrate 62, it is possible for the capacitor to be provided with a passive element such as an inductor, a registor, or a VRM (voltage regulator model) for example.

Figure 11:
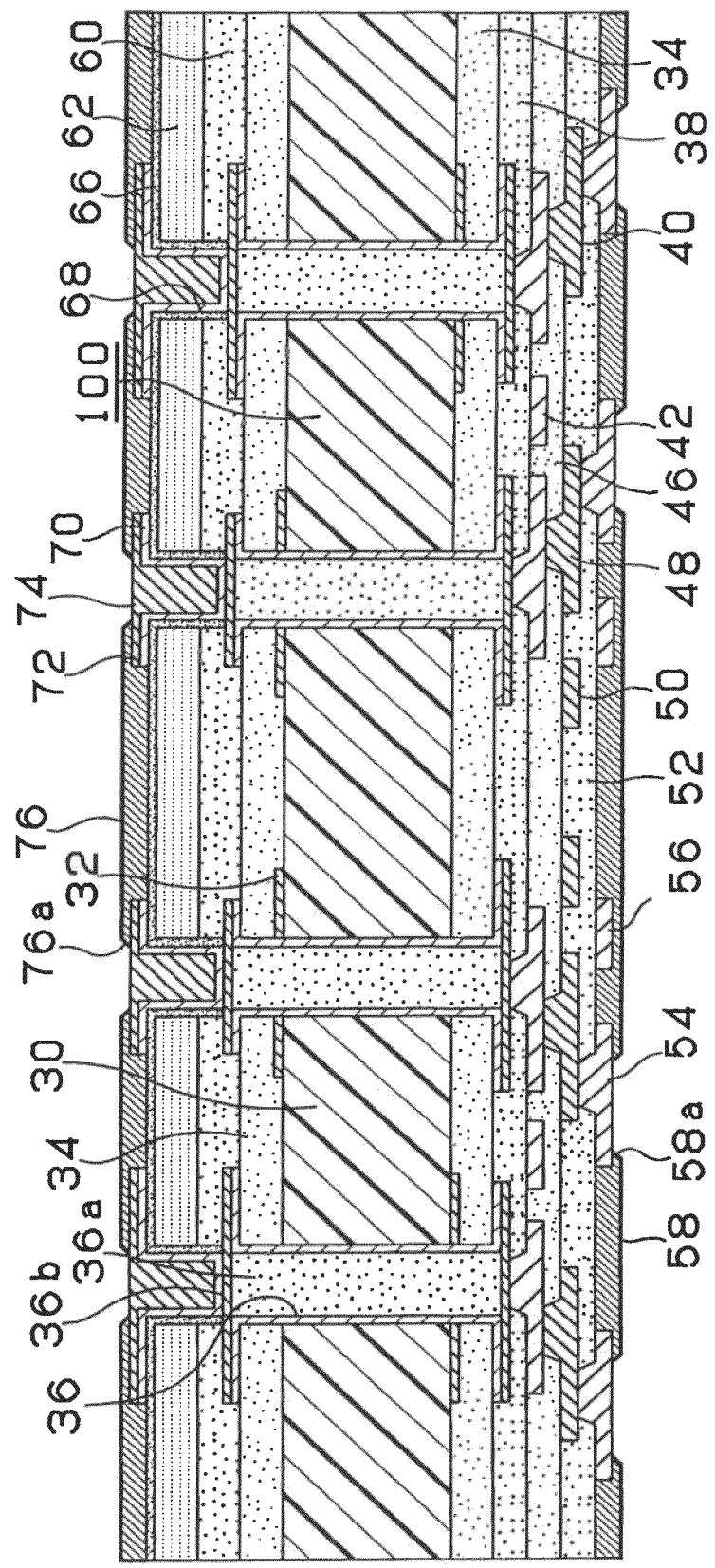
FIG. 11 is a cross-sectional view of a substrate for mounting an IC chip pertaining to a second embodiment of the present invention.

FIG. 11 is a cross-sectional view of the substrate 100 in accordance with the second embodiment of the present invention. In the above-described first embodiment, build-up wiring layers 12, 14, 16, 22, 24, and 26 were formed on the silicon substrate 62. In the second embodiment, the IC chip 90 is directly connected to the through-hole conductors 74 without build-up wiring layers being provided.

Figure 12:
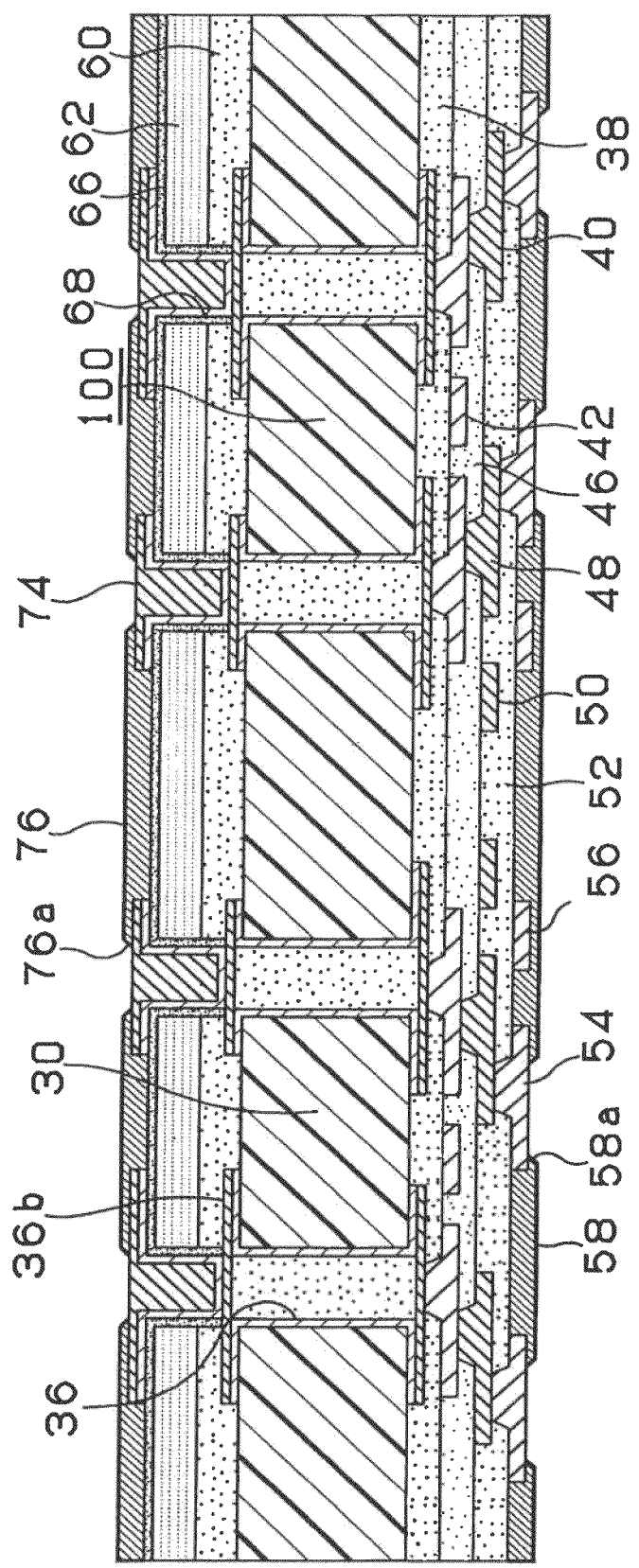
FIG. 12 is a cross-sectional view of a substrate for mounting an IC chip pertaining to a third embodiment of the present invention.

FIG. 12 is a cross-sectional view of the IC substrate 100 in accordance with the third embodiment of the present invention. The above-described first and second embodiments were formed such that the through holes 36 ran through the core substrate 30 and inter-laminar resin insulating layers 34. In the third embodiment, the through holes 36 run through the core substrate 30, the conductor pads for mounting 36b are formed on the core substrate 30, and the through-hole conductors 74 of the silicon substrate 62 are connected to the lands of the conductor pads for mounting 36b.

A method for manufacturing the IC substrate 100 according to the fourth embodiment will be described with reference to FIG. 13. In the first through third embodiments, through holes 64 were bored after the silicon substrate 62 was adhered to the low-elasticity resin layer 60. In the fourth embodiment, a silicon substrate 62 with via holes 62a having been formed in advance is adhered to the IC substrate 100 illustrated in FIG. 13(A). See FIG. 13(B). The through holes 64 are bored into the low-elasticity resin layer 60 by laser via said via holes 62a (FIG. 13(C)). The description of the subsequent steps is omitted since they are identical to the steps of manufacturing described above with regard to the first embodiment. The fourth embodiment of the present invention offers the advantage of an ease of processing.

Figure 14:
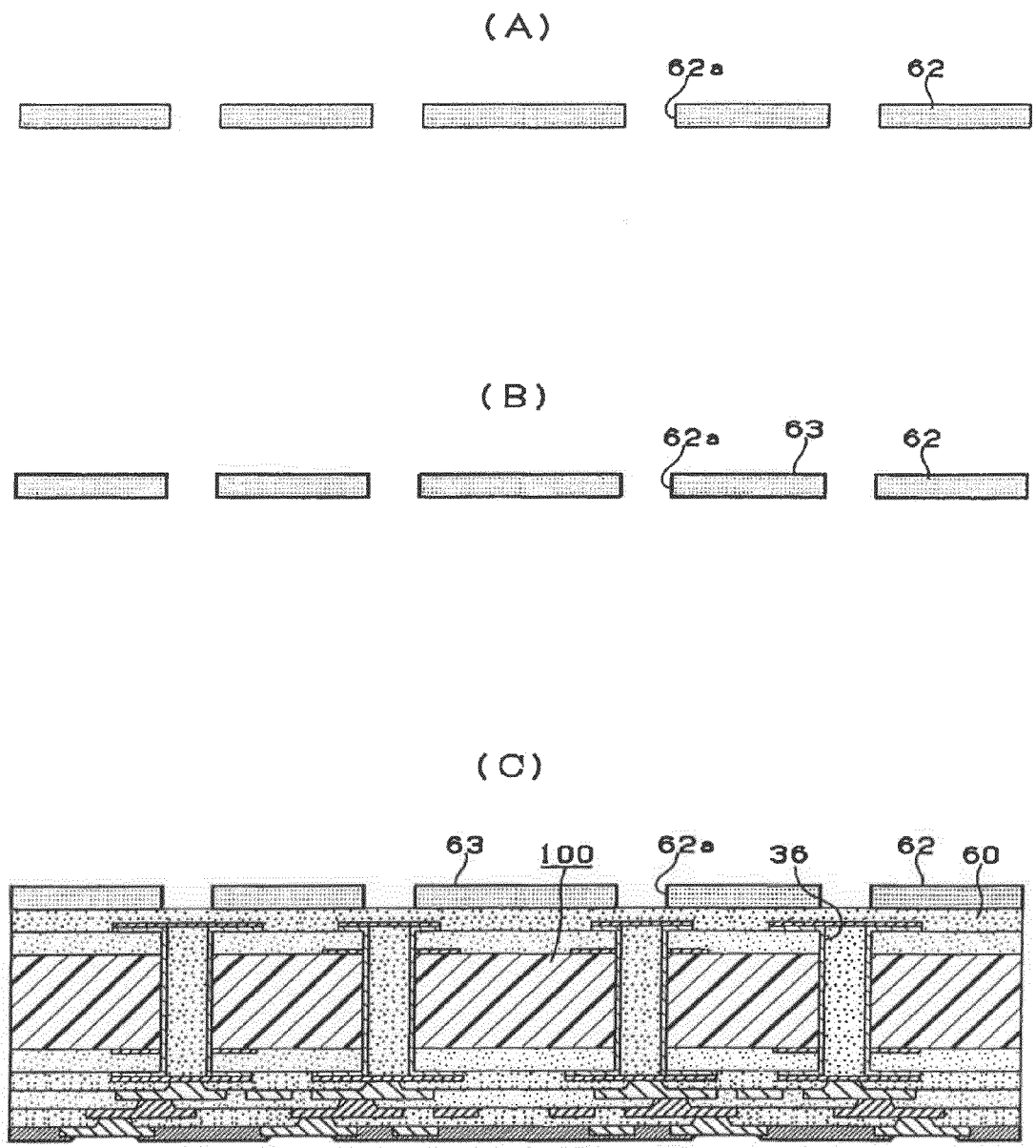
FIG. 14 is a cross-sectional view of a multilayer build-up wiring board illustrating a method for manufacturing a substrate for mounting an IC chip in accordance with a fifth embodiment of the present invention.

A method for manufacturing the IC substrate 100 pertaining to the fifth embodiment of the present invention will be described with reference to FIGS. 14 and 15. In the fifth embodiment, an insulating film 63 is formed on the silicon substrate 62 provided with via holes 62a illustrated in FIG. 14(A). The formation of this insulating film 63 is carried out by a thermal oxidation treatment at about 1,000° C. performed on the silicon substrate 62, for example. An insulating film may be formed by CVD in place of the thermal oxidation treatment.

The silicon substrate 62 provided with via holes 62a and with the insulating film 63 being formed thereon is adhered to the IC substrate 100 (FIG. 14(C)), and through holes 64 are bored into the low-elasticity resin layer 60 by laser via said via holes 62a (FIG. 15(D)). Subsequently, as with the first embodiment described above with reference to FIG. 2(C) and FIG. 3(A), an electroless-plated film 70 is formed by electroless plating on the surface of the silicon substrate 62 and on the through holes 64, and the electrolysis plating is carried out via the electroless-plated film 70 to fill the inside of the through holes 64 with electrolysis plating 72 (FIG. 15(B)).

The description of the subsequent steps is omitted since they are identical to the steps of the first embodiment. The fifth embodiment also offers the advantage of an case of processing.

In the embodiments described above, while a silicon substrate was used as a low-thermal-expansion substrate, a low-thermal-expansion substrate of a ceramic material, other than silicon, such as silicon nitride, silicon carbide, aluminum nitride, and mullite may also be used.

Obviously, numerous modifications and variations of the present invention are possible in light of the above teachings. It is therefore to be understood that within the scope of the appended claims, the invention may be practiced otherwise than as specifically described herein.

The invention claimed is:

1. A substrate for mounting an IC chip comprising;
a printed substrate including a first build-up layer having a first conductor layer including a plurality of first conductor circuits:
a low-elasticity resin layer formed on the first build-up layer of the printed substrate;
a low-thermal-expansion substrate formed on the low-elasticity resin layer and comprising one of ceramics and silicon;
a plurality of through-hole conductors extending through the low-thermal-expansion substrate and the low-elasticity resin layer;
a second conductor layer including a plurality of second conductor circuits and formed on the low-thermal-expansion substrate, the through-hole conductors electrically connect the first conductor circuits of the first conductor layer in the printed substrate and the second conductor circuits of the second conductor layer on the low-thermal-expansion substrate; and
at least one resin layer provided above the low-thermal-expansion substrate such that the at least one resin layer is interposed between the low thermal-expansion substrate and an IC chip when the IC chip is mounted to the substrate.

2. The substrate for mounting an IC chip as set forth in claim 1, further comprising a second build-up layer comprising a third conductor layer having a plurality of third conductor circuits and an inter-laminar resin insulating layer, wherein the second build-up layer is formed on the low-thermal-expansion substrate and the second conductor circuits.

3. The substrate for mounting an IC chip as set forth in claim 2, further comprising a fourth conductor layer comprising a plurality of pads and provided on an outermost layer of the second build-up layer, and the plurality of pads of the fourth conductor layer has a pitch which is narrower than a pitch for the through-hole conductors.

4. The substrate for mounting an IC chip as set forth in claim 2, wherein the second conductor circuits of the second conductor layer is substantially the same pitch as a pitch for the through-hole conductors.

5. The substrate for mounting an IC chip as set forth in claim 1, wherein the second conductor circuits have conductor pads, and a diameter of the through-hole conductors is smaller than a diameter of the conductor pads of the second conductor circuits.

6. The substrate for mounting an IC chip as set forth in claim 1, wherein the low-thermal-expansion substrate is made of silicon.

7. The substrate for mounting an IC chip as set forth in claim 1, wherein the low-elasticity resin layer is made of at least one composition comprising an epoxy resin, a phenol resin crosslinking rubber particles, and a hardening catalyst.

8. The substrate for mounting an IC chip as set forth in claim 7, wherein the low-elasticity resin layer has Young's modulus at 30° C. in a range of 10 MPa through 1 GPa.

9. The substrate for mounting an IC chip as set forth in claim 1, further comprising at least one element selected from the group consisting of an inductor, a capacitor, a resistor, and a voltage regulator module, wherein the at least one element is provided on the low-thermal-expansion substrate.

* * * * *